(12) United States Patent
Lee et al.

(10) Patent No.: US 11,508,815 B2
(45) Date of Patent: Nov. 22, 2022

(54) SEMICONDUCTOR DEVICE INCLUDING TWO-DIMENSIONAL SEMICONDUCTOR MATERIAL

(71) Applicant: Samsung Electronics Co., Ltd., Suwon-si (KR)

(72) Inventors: Minhyun Lee, Suwon-si (KR); Minsu Seol, Seoul (KR); Yeonchoo Cho, Seongnam-si (KR); Hyeonjin Shin, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 16/928,508

(22) Filed: Jul. 14, 2020

(65) Prior Publication Data

US 2021/0226011 A1    Jul. 22, 2021

(30) Foreign Application Priority Data

Jan. 21, 2020    (KR) .......................... 10-2020-0007964

(51) Int. Cl.
*H01L 29/10*    (2006.01)
*H01L 21/02*    (2006.01)
(Continued)

(52) U.S. Cl.
CPC .... *H01L 29/1037* (2013.01); *H01L 21/02568* (2013.01); *H01L 29/408* (2013.01);
(Continued)

(58) Field of Classification Search
CPC ........... H01L 29/1037; H01L 21/02568; H01L 29/408; H01L 29/41791; H01L 29/42364;
(Continued)

(56) References Cited

U.S. PATENT DOCUMENTS

| 5,196,912 A | 3/1993 | Matsumoto et al. |
| 9,240,478 B2 | 1/2016 | Chang et al. |

(Continued)

FOREIGN PATENT DOCUMENTS

| EP | 2620981 A2 | 7/2013 |
| JP | 2011192843 A | 9/2011 |

(Continued)

OTHER PUBLICATIONS

Hyun Gu Kim et al., "Atomic Layer Deposition on 2D Materials" American Chemical Society, Chem. Mater. 2017, 29, 3809-3826.
(Continued)

*Primary Examiner* — Cuong B Nguyen
(74) *Attorney, Agent, or Firm* — Harness, Dickey & Pierce, P.L.C.

(57) ABSTRACT

Provided is a semiconductor device which use a two-dimensional semiconductor material as a channel layer. The semiconductor device includes: a gate electrode on a substrate; a gate dielectric on the gate electrode; a channel layer on the gate dielectric; and a source electrode and a drain electrode that may be electrically connected to the channel layer. The gate dielectric has a shape with a height greater than a width, and the channel layer includes a two-dimensional semiconductor material.

15 Claims, 16 Drawing Sheets

(51) Int. Cl.
*H01L 29/40* (2006.01)
*H01L 29/417* (2006.01)
*H01L 29/423* (2006.01)
*H01L 29/66* (2006.01)
*H01L 29/78* (2006.01)

(52) U.S. Cl.
CPC .. *H01L 29/41791* (2013.01); *H01L 29/42364* (2013.01); *H01L 29/66795* (2013.01); *H01L 29/785* (2013.01)

(58) Field of Classification Search
CPC ............. H01L 29/66795; H01L 29/785; H01L 29/42372; H01L 29/1606; H01L 29/516; H01L 29/78391; H01L 29/792; H01L 29/778; H01L 21/02527; H01L 21/02543; H01L 21/76898; H01L 21/823418; H01L 21/823431; H01L 21/823456; H01L 21/82385; H01L 29/16006; H01L 29/4232; H01L 29/1033; H01L 29/42356
See application file for complete search history.

(56) References Cited

U.S. PATENT DOCUMENTS

| | | |
|---|---|---|
| 9,257,508 B2 | 2/2016 | Lee et al. |
| 9,553,199 B2 | 1/2017 | Hou et al. |
| 9,658,186 B2 | 5/2017 | Yang et al. |
| 9,711,647 B2 | 7/2017 | van Dal et al. |
| 9,768,313 B2 | 9/2017 | Yeh et al. |
| 10,056,498 B2 | 8/2018 | Yeh et al. |
| 10,084,066 B2 | 9/2018 | Lin et al. |
| 10,269,791 B2 | 4/2019 | Yeo et al. |
| 10,269,981 B2 | 4/2019 | Chen et al. |
| 2007/0138476 A1* | 6/2007 | Chae .................... H01L 27/124 257/E29.151 |
| 2013/0193412 A1* | 8/2013 | Lee ........................ H01L 29/778 257/29 |
| 2016/0365459 A1* | 12/2016 | Hong .................... G02F 1/1368 |
| 2018/0182849 A1 | 6/2018 | Allan et al. |
| 2018/0182898 A1 | 6/2018 | Moroz et al. |
| 2019/0295276 A1 | 9/2019 | Blonde et al. |
| 2020/0343379 A1* | 10/2020 | Sharma ................. H01L 29/458 |

FOREIGN PATENT DOCUMENTS

| | | |
|---|---|---|
| KR | 20170004676 A | 1/2017 |
| KR | 101878741 B1 | 7/2018 |

OTHER PUBLICATIONS

Rui Cheng et al, "Few-layer molybdenum disulfide transistors and circuits for high-speed flexible electronics" Nature Communications, Published Oct. 8, 2014, pp. 1-9.

Zhihao Yu et al, "Analyzing the Carrier Mobility in Transition-Metal Dichalcogenide MoS2 Field-Effect Transistors" Wiley-VCH Verlag GmbH & Co. KGaA, Weinheim, Adv. Funct. Mater. 2017, pp. 1-17.

Kibum Kang et al, "High-mobility three-atom-thick semiconducting films with wafer-scale homogeneity" Nature, vol. 520, Apr. 30, 2015, pp. 656-660.

Extended European Search Report dated Mar. 3, 2021, issued in corresponding European Patent Application No. 20194364.4.

\* cited by examiner

SEMICONDUCTOR DEVICE INCLUDING TWO-DIMENSIONAL SEMICONDUCTOR MATERIAL

CROSS-REFERENCE TO RELATED APPLICATION

This application claims the benefit of Korean Patent Application No. 10-2020-0007964, filed on Jan. 21, 2020, in the Korean Intellectual Property Office, the disclosure of which is incorporated herein in its entirety by reference.

BACKGROUND

1. Field

The present disclosure relates to semiconductor devices, and more particularly, to semiconductor devices which use a two-dimensional semiconductor material as a channel layer.

2. Description of Related Art

Transistors are semiconductor devices having an electrical switching function and are used in various semiconductor products such as memories and driver integrated circuits (ICs). When the size of semiconductor devices is small, more semiconductor devices may be obtained from one wafer, and the driving speed of the semiconductor devices may increase. Thus, research has been intensively conducted into reducing the size of semiconductor devices.

There is a limit to reducing the size of transistors such as metal oxide semiconductor field effect transistors (MOSFETs) having a flat structure, and thus recently, fin field effect transistors (FinFETs) having a three-dimensional structure have been intensively studied for the implementation of micro devices.

SUMMARY

Provided are semiconductor devices which use a two-dimensional semiconductor material as a channel layer.

Additional aspects will be set forth in part in the description which follows and, in part, will be apparent from the description, or may be learned by practice of the presented embodiments of the disclosure.

According to an embodiment, a semiconductor device includes: a substrate; a gate electrode on the substrate, the gate electrode having a shape with a height greater than a width; a gate dielectric on the gate electrode; a channel layer on the gate dielectric, the channel layer including a two-dimensional semiconductor material; and a source electrode and a drain electrode that may be electrically connected to the channel layer.

In some embodiments, the substrate may include an insulating material. The substrate may further include a semiconductor material.

In some embodiments, the gate electrode may have a height/width ratio that is greater than about 1 but less than about 20.

In some embodiments, the gate electrode may include a metallic material or a conductive oxide.

In some embodiments, the gate electrode may include a conductive layer and a dielectric provided in the conductive layer.

In some embodiments, the gate dielectric may include a high-k material, a ferroelectric material, or both the high-k material and the ferroelectric material. The gate dielectric may include a charge trapping material.

In some embodiments, the two-dimensional semiconductor material may include, for example, graphene, black phosphorus, a transition metal dichalcogenide (TMD), or a combination thereof.

In some embodiments, the channel layer may have a thickness of about 10 nm or less (e.g., greater than 0 nm and less than or equal to 10 nm).

In some embodiments, the source electrode and the drain electrode may overlap the gate electrode.

In some embodiments, the gate dielectric may include a first dielectric and a second dielectric. The first dielectric may extend from a first end portion of the gate electrode. The second dielectric may extend from a second end portion of the gate electrode. The source and drain electrodes may overlap the first dielectric and the second dielectric, respectively.

In some embodiments, the semiconductor device may further include an interconnect in the substrate and the interconnect may be electrically connected to the gate electrode.

In some embodiments, the semiconductor device may further include an interconnect on an upper portion of the gate electrode and the interconnect may be electrically connected to the gate electrode.

According to an embodiment, a semiconductor device includes: a substrate; a plurality of gate electrodes on the substrate, each of the plurality of gate electrodes having a shape with a height greater than a width; a connection electrode on the substrate, the connection electrode connecting the plurality of gate electrodes to each other; a plurality of gate dielectrics on the plurality of gate electrodes; a plurality of channel layers on the plurality of gate dielectrics, the plurality of channel layers including a two-dimensional semiconductor material; and a source electrode and a drain electrode that may be are electrically connected to the plurality of channel layers.

In some embodiments, the plurality of gate electrodes may be arranged side by side with each other.

In some embodiments, the connection electrode may be provided in one piece with the plurality of gate electrodes.

In some embodiments, the semiconductor device may further include an interconnect electrically connected to the connection electrode. The interconnect may be in contact with the connection electrode between the plurality of channel layers.

In some embodiments, the two-dimensional semiconductor material may include, for example, graphene, black phosphorus, a transition metal dichalcogenide (TMD), or a combination thereof.

According to an embodiment, a semiconductor device includes: a substrate; a gate electrode on an upper surface of the substrate; a gate dielectric on the substrate, the gate dielectric including a portion covering the gate electrode and having a shape with a height greater than a width; a channel layer on the gate electric and the gate electrode, the channel layer comprising a two-dimensional semiconductor material; and a source electrode and a drain electrode electrically connected to the channel layer.

In some embodiments, the substrate may include an insulating material.

In some embodiments, the two-dimensional semiconductor material may include graphene, black phosphorus, a transition metal dichalcogenide (TMD), or a combination thereof.

In some embodiments, the channel layer may have a thickness of greater than 0 nm and about 10 nm or less.

In some embodiments, a ratio of the height of the gate electrode to a width of the gate electrode may be greater than about 1 and less than about 20.

BRIEF DESCRIPTION OF THE DRAWINGS

The above and other aspects, features, and effects of embodiments of inventive concepts will be more apparent from the following description taken in conjunction with the accompanying drawings, in which.

DETAILED DESCRIPTION

Figure 1:
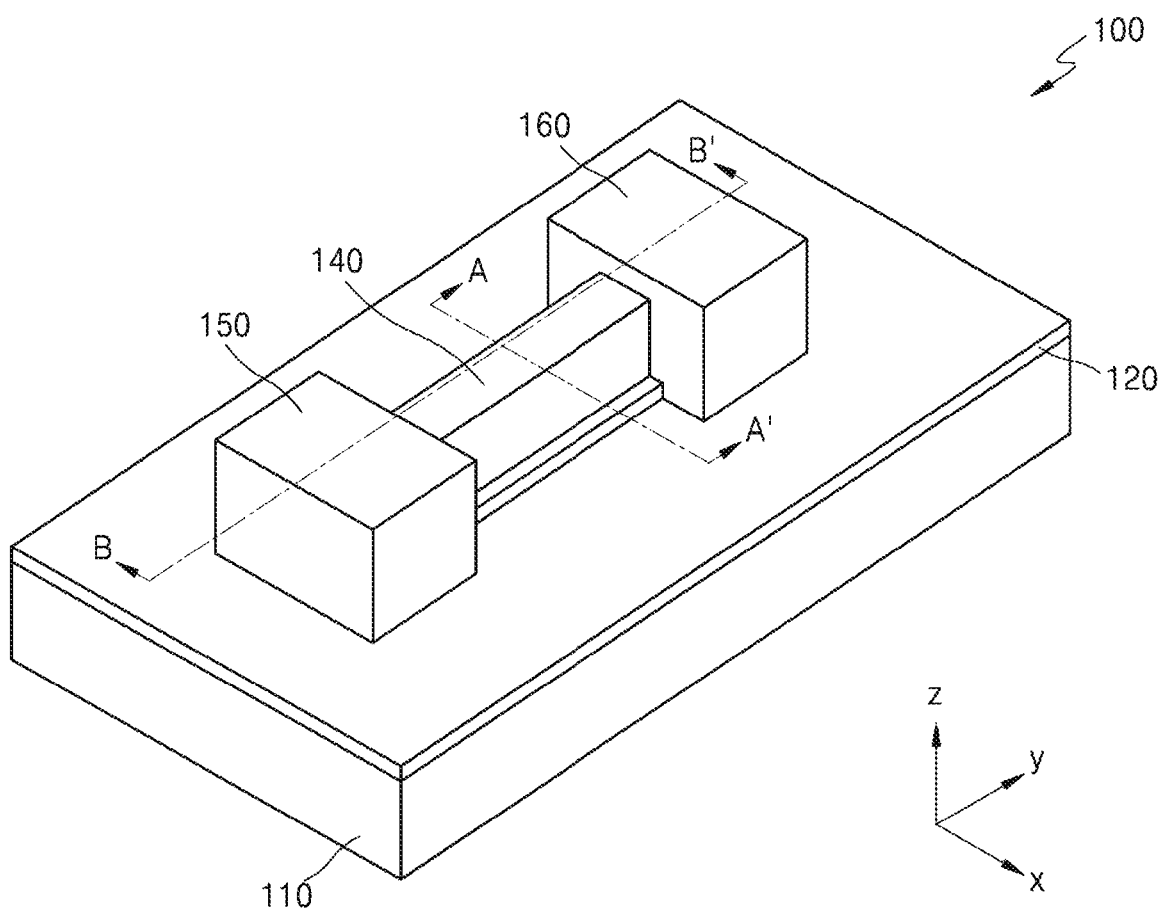
FIG. 1 is a perspective view illustrating a semiconductor device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," "at least one of A, B, or C," "one of A, B, C, or a combination thereof," and "one of A, B, C, and a combination thereof," respectively, may be construed as covering any one of the following combinations: A; B; A and B; A and C; B and C; and A, B, and C."

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes unless the context indicates otherwise.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on the other element while making contact with the other element or may be above the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative pronoun may be construed as the element or the elements even though it has a singular form. Operations of a method may be performed in appropriate order unless explicitly described in terms of order or described to the contrary. That is, operations are not limited to the order in which the operations are described.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples are just used herein to describe technical ideas and should not be considered for purposes of limitation unless defined by the claims.

Figure 2:
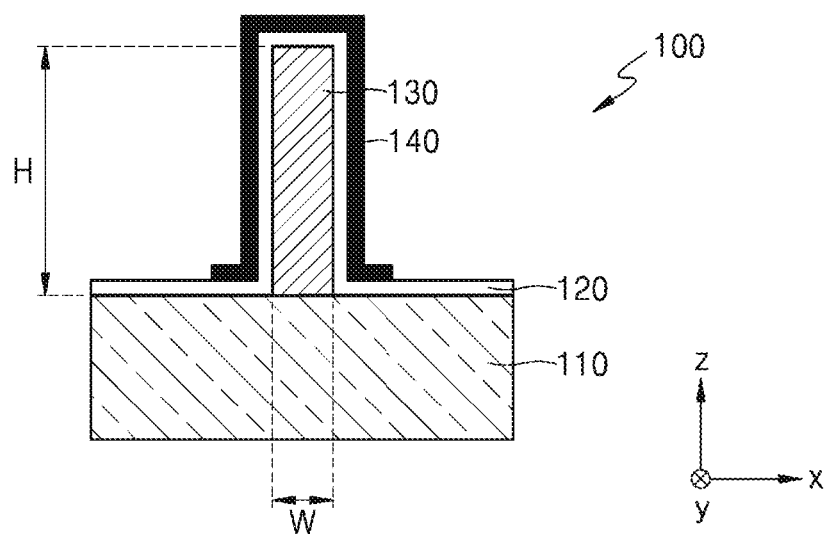
FIG. 2 is a cross-sectional view taken along line A-A' of FIG. 1.
Figure 3:
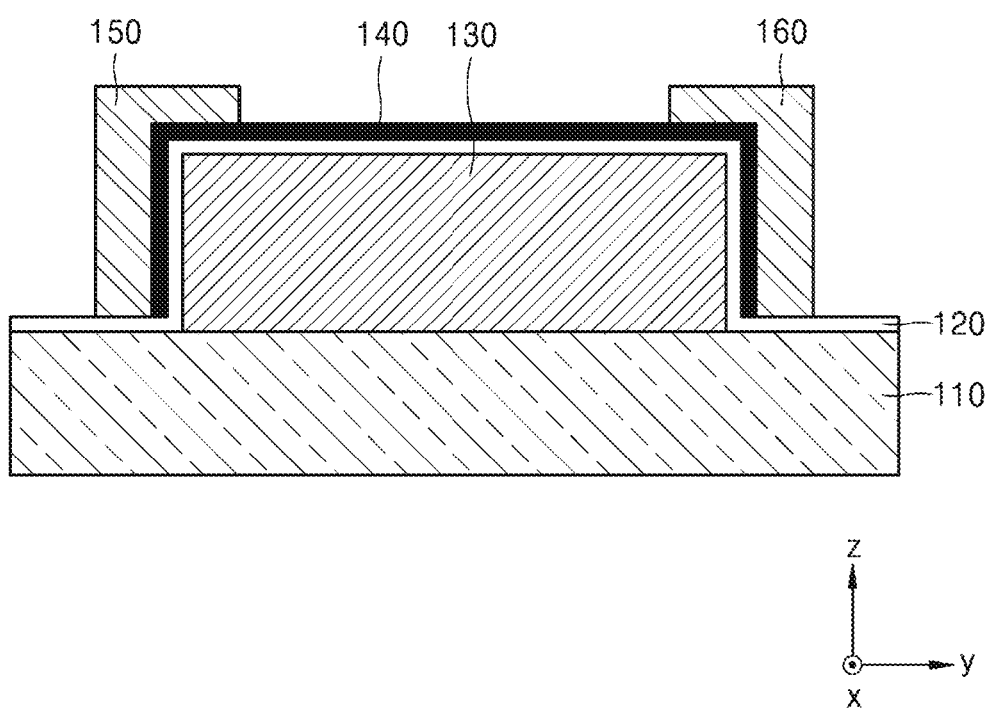
FIG. 3 is a cross-sectional view taken along line B-B' of FIG. 1.

FIG. 1 is a perspective view illustrating a semiconductor device 100 according to an example embodiment. FIG. 2 is a cross-sectional view taken along line A-A' of FIG. 1, and FIG. 3 is a cross-sectional view taken along line B-B' of FIG. 1. The semiconductor device 100 illustrated in FIGS. 1 to 3 may include a Fin field effect transistor (FinFET).

Referring to FIGS. 1 to 3, the semiconductor device 100 includes a gate electrode 130, a gate dielectric 120, a channel layer 140, a source electrode 150, and a drain electrode 160. The gate electrode 130 may be provided on a substrate 110. The substrate 110 may include, for example, an insulating substrate. In addition, the substrate 110 may include a semiconductor substrate (not shown) having an insulating layer formed on a surface thereof. The semiconductor substrate 110 may include, for example, silicon (Si), germanium (Ge), SiGe, or a Group III-V semiconductor material. However, the substrate 110 is not limited thereto. For example, the substrate 110 may include a silicon substrate having a silicon oxide formed on a surface thereof.

The gate electrode 130 is provided on an upper surface of the substrate 110. The gate electrode 130 may have a fin shape. The gate electrode 130 may have a width W, a height H, and a length. FIG. 1 illustrates the width W of the gate electrode 130 defined in an x-axis direction, the height H of the gate electrode 130 defined in a z-axis direction, and the length of the gate electrode 130 defined in a y-axis direction.

The gate electrode 130 is shaped such that the height H of the gate electrode 130 is greater than the width W of the gate electrode 130. That is, the ratio of the height H to the width W of the gate electrode 130, that is, the aspect ratio of the gate electrode 130, may be greater than about 1 (e.g., in a range of about 1 to about 5, about 1 to about 10, about 1 to about 20, but not limited thereto). In addition, the ratio of the height H to the width W of the gate electrode 130 may be less than about 20, but is not limited thereto.

The gate electrode 130 may have, for example, a rectangular cross-section. In this case, the gate electrode 130 may be arranged substantially perpendicular to a surface of the substrate 110. Here, the expression "substantially perpendicular" refers to exactly perpendicular or nearly perpendicular.

The gate electrode 130 may include a metallic material or a conductive oxide. Here, the metallic material may include, for example, at least one of (or selected from the group consisting of) gold (Au), titanium (Ti), TiN, TaN, tungsten (W), molybdenum (Mo), WN, platinum (Pt), and nickel (Ni). In addition, the conductive oxide may include, for example, indium tin oxide (ITO), indium zinc oxide (IZO), or the like. However, these materials are merely examples.

The gate dielectric 120 may be provided on the gate electrode 130. The gate dielectric 120 may be provided on the upper surface of the substrate to cover the surface of the gate electrode 130. The gate dielectric 120 may be formed by depositing an insulating material on the upper surface of the substrate 110 to cover the gate electrode 130 by, for example, chemical vapor deposition (CVD), atomic layer deposition (ALD), or physical vapor deposition (PVD).

The gate dielectric 120 may include, for example, a high-k dielectric material (e.g., a material having a dielectric constant that is greater than a dielectric constant of silicon oxide). For example, the gate dielectric 120 may include an aluminum oxide, a hafnium oxide, a zirconium-hafnium oxide, a lanthanum oxide, or the like, but is not limited thereto.

The gate dielectric 120 may include a ferroelectric material. The ferroelectric material has a spontaneous dipole (electric dipole), that is, a spontaneous polarization, in a crystallized material structure because the charge distribution in a unit cell is non-centrosymmetric. Thus, the ferroelectric material has a residual polarization due to dipoles even when no external electric field is applied to the ferroelectric material. In addition, the direction of polarization may be switched on a domain basis by an external electric field. The ferroelectric material may include, for example, at least one oxide of (or selected from the group consisting of) hafnium (Hf), silicon (Si), aluminum (Al), zirconium (Zr), yttrium (Y), lanthanum (La), gadolinium (Gd), and strontium (Sr). However, these materials are examples. In addition, the ferroelectric material may further include a dopant if necessary or desired.

The semiconductor device 100 in which the gate dielectric 120 includes a ferroelectric material may be applied to, for example, a logic device or a memory device. When the gate dielectric 120 includes a ferroelectric material as described above, the subthreshold swing (SS) of the semiconductor device 100 may be lowered by the negative capacitance effect, thereby improving the performance of the semiconductor device 100 and reducing the size of the semiconductor device.

The gate dielectric 120 may have a multilayer structure including a high-k material and a ferroelectric material. In addition, the gate dielectric 120 may include a charge trapping layer such as a silicon nitride layer, and in this case, the semiconductor device 100 may have memory characteristics.

The channel layer 140 is provided on the gate dielectric 120. Here, the channel layer 140 is provided on the gate dielectric 120 which covers the gate electrode 130. The channel layer 140 may include a two-dimensional semiconductor material. The term "two-dimensional semiconductor material" refers to a semiconductor material having a two-dimensional crystal structure, which may have a monolayer or multilayer structure. Each layer of the two-dimensional semiconductor material may have an atomic level thickness. In the present embodiment, the two-dimensional semiconductor material of the channel layer 140 may have a thickness of greater than 0 nm and about 10 nm or less. However, the two-dimensional semiconductor material is not limited thereto.

The two-dimensional semiconductor material has good electrical characteristics, and even when the two-dimensional semiconductor material has a nanoscale thickness, the two-dimensional semiconductor material does not show large variations in the characteristics thereof and maintains high mobility such that the two-dimensional semiconductor material may be applied to various devices.

The two-dimensional semiconductor material may include, for example, at least one of (or selected from the group consisting of) graphene, black phosphorus, and a transition metal dichalcogenide (TMD). Graphene is a material having a hexagonal honeycomb structure in which carbon atoms are two-dimensionally bonded, and compared to silicon (Si), graphene has high electrical mobility, good thermal properties, chemical stability, and a large surface area. In addition, black phosphorus is a material in which black phosphorus atoms are two-dimensionally bonded.

For example, the TMD may include: a transition metal selected from molybdenum (Mo), tungsten (W), niobium (Nb), vanadium (V), tantalum (Ta), titanium (Ti), zirconium (Zr), hafnium (Hf), technetium (Tc), or rhenium (Re); and a chalcogen selected from sulfur (S), selenium (Se), or tellurium (Te). The TMD may be expressed as, for example, $MX_2$ where M refers to a transition metal, and X refers to a chalcogen. For example, M may be molybdenum (Mo), tungsten (W), niobium (Nb), vanadium (V), tantalum (Ta), titanium (Ti), zirconium (Zr), hafnium (Hf), technetium (Tc), rhenium (Re), or the like, and X may be sulfur (S), selenium (Se), tellurium (Te), or the like. Thus, for example, the TDM may include $MoS_2$, $MoSe_2$, $MoTe_2$, $W_{S2}$, $WSe_2$, $WTe_2$, $ZrS_2$, $ZrSe_2$, $HfS_2$, $HfSe_2$, $NbSe_2$, $ReSe_2$, or the like. Alternatively, the TMD may not be expressed as $MX_2$. In this case, for example, the TMD may include CuS which is a compound of a transition metal, copper (Cu), and a chalcogen, sulfur (S). Alternatively, the TMD may be a chalcogenide including a non-transition metal. The non-transition metal may include, for example, gallium (Ga), indium (In), tin (Sn), germanium (Ge), lead (Pb), or the like.

In this case, the TMD may include: a compound of a non-transition metal such as gallium (Ga), indium (In), tin (Sn), germanium (Ge), or lead (Pb), and a chalcogen such as sulfur (S), selenium (Se), or tellurium (Te). For example, the TMD may include $SnSe_2$, GaS, GaSe, GaTe, GeSe, $In_2Se_3$, $InSnS_2$, or the like.

As described above, the TMD may include: a metal element selected from molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), or lead (Pb); and a chalcogen selected from sulfur (S), selenium (Se), or tellurium (Te). However, the materials mentioned above are merely examples, and examples of the TMD may include other materials which are not mentioned above.

The two-dimensional semiconductor material may be doped with a p-type dopant or an n-type dopant to control mobility. Here, for example, a p-type dopant and an n-type dopant used for graphene or carbon nanotubes (CNTs) may be used as the p-type dopant and the n-type dopant. The p-type dopant or the n-type dopant may be implanted by an ion implantation method or a chemical doping method.

Examples of a source of the p-type dopant may include: ionic liquids such as $NO_2BF_4$, $NOBF_4$, or $NO_2SbF_6$; acidic compounds such as HCl, $H_3PO_4$, $CH_3COOH$, $H_2SO_4$, or $HNO_3$; and organic compounds such as dichlorodicyanoquinone (DDQ), Oxone, dimyristoylphosphatidylinositol (DMPI), or trifluoromethanesulfoneimide. Other examples of the source of the p-type dopant may include $HPtCl_4$, $AuCl_3$, $HAuCl_4$, AgOTf (silver trifluoromethanesulfonate), $AgNO_3$, $H_2PdCl_6$, $Pd(OAc)_2$, and $Cu(CN)_2$.

Examples of a source of the n-type dopant may include: a reduction product of a substituted or unsubstituted nicotinamide; a reduction product of a compound which is chemically bound to a substituted or unsubstituted nicotinamide; and a compound including at least two pyridinium moieties in which a nitrogen atom of at least one of the pyridinium moieties is reduced. For example, the source of the n-type dopant may include nicotinamide mononucleotide-H (NMNH), nicotinamide adenine dinucleotide-H (NADH), nicotinamide adenine dinucleotide phosphate-H (NADPH), or viologen. Alternatively, the source of the n-type dopant may include a polymer such as polyethylenimine (PEI). Alternatively, the n-type dopant may include an alkali metal such as potassium (K) or lithium (Li). The above-listed p-type dopant materials and n-type dopant materials are examples. That is, other materials may be used as the p-type dopant and the n-type dopant.

The channel layer 140 may be formed by depositing a two-dimensional semiconductor material on the gate dielectric 120 by a method such as metal organic CVD (MOCVD) or ALD, and patterning the two-dimensional semiconductor material.

The source electrode 150 and the drain electrode 160 are provided on both sides of the channel layer 140, respectively. Here, the source electrode 150 and the drain electrode 160 are in contact with the channel layer 140 and are electrically connected to the channel layer 140. In this case, the source electrode 150 and the drain electrode 160 may overlap the gate electrode 130. The source electrode 150 and the drain electrode 160 may include, for example, a metallic material having high electrical conductivity, such as silver (Ag), gold (Au), platinum (Pt), or copper (Cu), but are not limited thereto.

When the thickness of silicon (Si) of a Si-based FinFET is several nanometers (nm) or less, the number of carriers in the silicon reduces, and thus electron mobility reduces. In the present embodiment, however, the channel layer 140 includes a two-dimensional semiconductor material, and thus even when the thickness of the channel layer 140 is several nanometers (nm) or less, high electron mobility may be maintained. Therefore, a high-performance semiconductor device having a fine size, for example, an FinFET having a fine channel width within the range of about 10 nm or less (e.g., greater than 0 nm and less than or equal to 10 nm) may be realized.

A high Schottky Barrier may be formed between the channel layer 140 including a two-dimensional semiconductor material and the source and drain electrodes 150 and 160, and thus contact resistance may increase. In the present embodiment, the gate electrode 130 having a fin shape overlaps the source and drain electrodes 150 and 160 such that the Schottky barrier formed between the channel layer 140 including a two-dimensional semiconductor material and the source and drain electrodes 150 and 160 may be reduced by a gating effect, and thus on-current may be increased.

Figure 4:
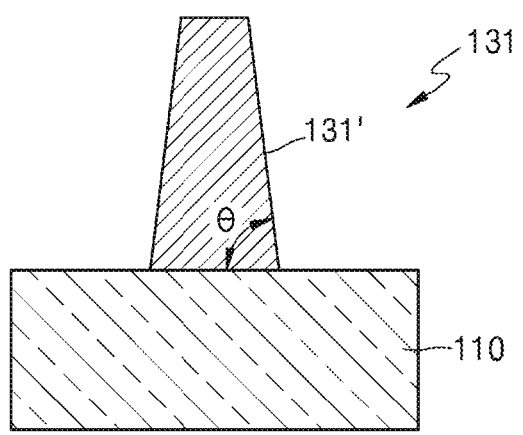
FIG. 4 is a view illustrating a modification of a gate electrode that may be employed in the semiconductor device shown in FIG. 1.

FIG. 4 is a view illustrating a modification of the gate electrode 130 that may be employed in the semiconductor device 100 shown in FIG. 1.

Referring to FIG. 4, a gate electrode 131 may have a trapezoidal cross-section. In this case, the gate electrode 131 is shaped such that the height of the gate electrode 131 is greater than the maximum width of the gate electrode 131. That is, the ratio of the height to the maximum width of the gate electrode 131 may be greater than about 1 (e.g., in a range of about 1 to about 5, about 1 to about 10, about 1 to about 20, but not limited thereto). The gate electrode 131 may be arranged substantially perpendicular to the surface of the substrate 110. For example, the angle θ between an outer wall surface 131' of the gate electrode 131 and the surface of the substrate 110 may be, for example, greater than about 60 degrees but less than about 90 degrees.

Figure 14:
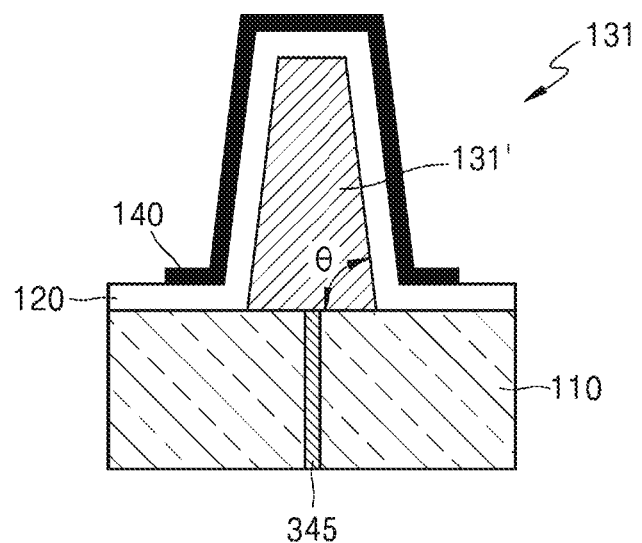
FIG. 14 is a view illustrating a modification of a gate electrode that may be employed in the semiconductor device shown in FIGS. 1 and 7.

In some embodiments, as depicted in FIG. 14, the semiconductor device in FIG. 4 may be further modified to include an interconnect 345 in the substrate 110 and electrically connected to the gate electrode 131 to apply an electrical signal to the gate electrode 131. For example, the interconnect 345 may be provided in the substrate 110 such that the interconnect 145 may be in contact with a lower surface of the gate electrode 131. The interconnect 345 may be formed by filling a conductive material in a through-hole formed in the substrate 110. The interconnect 345 may include, for example, a conductive material such as cobalt (Co) or tungsten (W). However, the interconnect 345 is not limited thereto, and examples of the conductive material may include various other materials.

Figure 5:
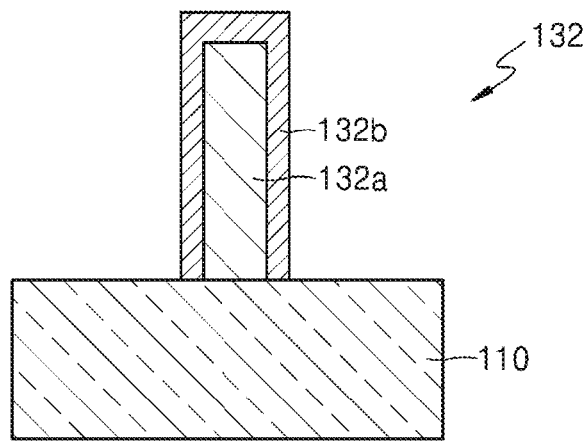
FIG. 5 is a view illustrating another modification of the gate electrode that may be employed in the semiconductor device shown in FIG. 1.

FIG. 5 is a view illustrating another modification of the gate electrode 130 that may be employed in the semiconductor device 100 shown in FIG. 1.

Referring to FIG. 5, a gate electrode 132 may include a conductive layer 132b and a dielectric 132a provided in the conductive layer 132b. The ratio of the height to the maximum width of the gate electrode 132 may be greater than about 1 (e.g., in a range of about 1 to about 5, about 1 to about 10, about 1 to about 20, but not limited thereto). Here, the conductive layer 132b may cover the surface of the dielectric 132a. The conductive layer 132b may include a metallic material or a conductive oxide. Here, the metallic material may include, for example, at least one of (or selected from the group consisting of) gold (Au), titanium (Ti), TiN, TaN, tungsten (W), molybdenum (Mo), WN, platinum (Pt), and nickel (Ni), and the conductive oxide may include, for example, ITO, IZO, or the like. In addition, Examples of the dielectric 132a may include various insulating materials.

Figure 6:
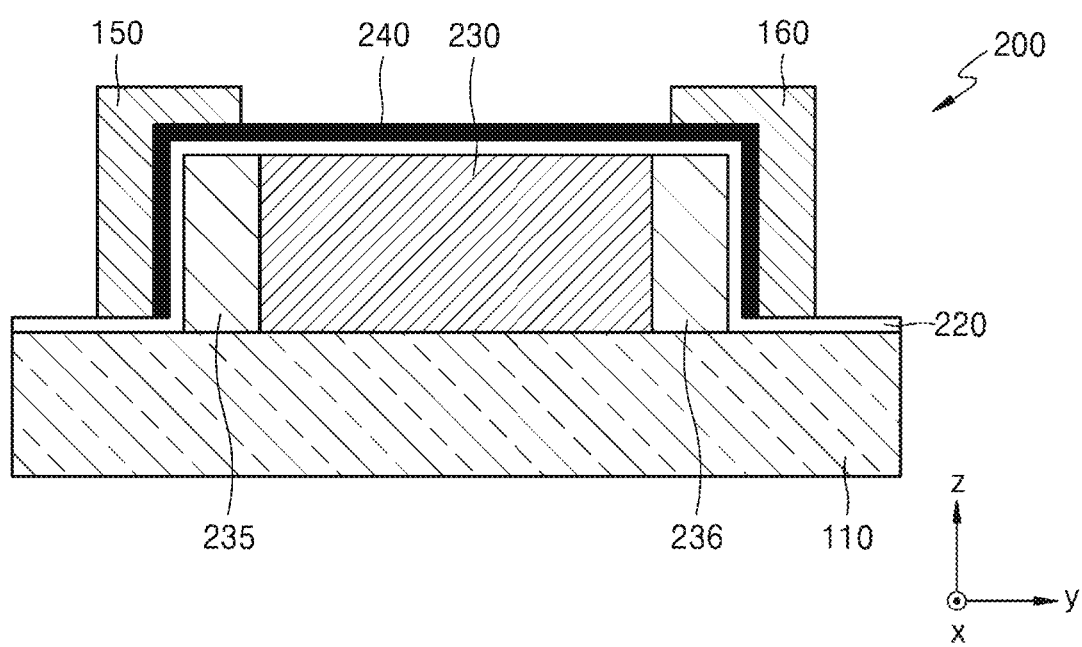
FIG. 6 is a cross-sectional view illustrating a semiconductor device according to another example embodiment.

FIG. 6 is a cross-sectional view illustrating a semiconductor device 200 according to another example embodiment.

Referring to FIG. 6, in the semiconductor device 200, a pin-shaped gate electrode 230 is provided on an upper surface of a substrate 110, and first and second dielectrics 235 and 236 are provided on both end portions of the gate electrode 230. The substrate 110 and the gate electrode 230 are the same as those described above, and thus descriptions thereof will not be repeated here.

In the length direction (for example, a y-axis direction) of the semiconductor device 200, the first dielectric 235 extends from an end portion of the gate electrode 230, and the second dielectric 236 extends from the other end portion of the gate electrode 230. Here, the first and second dielectrics 235 and 236 may include various insulating materials.

A gate dielectric 220 is provided on the gate electrode 230 and the first and second dielectrics 235 and 236. Here, the gate dielectric 220 may be provided on the upper surface of the substrate 110 to cover the surface of the gate electrode 230 and the surfaces of the first and second dielectrics 235 and 236. In addition, a channel layer 240 including a two-dimensional semiconductor material is provided on the gate dielectric 220. Since the gate dielectric 220 and the channel layer 240 are the same as those described above, descriptions thereof will not be repeated here.

A source electrode 150 and a drain electrode 160 are respectively provided on both sides of the channel layer 240 and are electrically connected to the channel layer 240. Here, the source electrode 150 may overlap the first dielectric 235, and the drain electrode 160 may overlap the second dielectric 236. Therefore, the source electrode 150 and the drain electrode 160 may not overlap the gate electrode 230.

Figure 7:
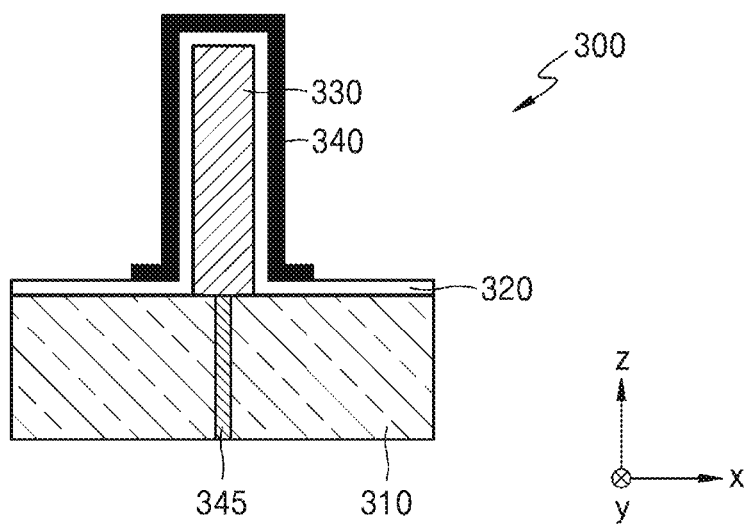
FIG. 7 is a cross-sectional view illustrating a semiconductor device according to another example embodiment.

FIG. 7 is a cross-sectional view illustrating a semiconductor device 300 according to another example embodiment. The semiconductor device 300 illustrated in FIG. 7 is the same as the semiconductor device 100 illustrated in FIG. 1 except that an interconnect 345 is provided in a substrate 310.

Referring to FIG. 7, a fin-shaped gate electrode 330 is provided on an upper surface of the substrate 310, and a gate dielectric 320 is provided to cover the gate electrode 330. In addition, a channel layer 340 including a two-dimensional semiconductor material is provided on the gate dielectric 320. In addition, although not shown in FIG. 7, a source electrode and a drain electrode are provided on both sides of the channel layer 340, respectively.

The source electrode and the drain electrode may overlap the gate electrode 330. Alternatively, the source electrode and the drain electrode may not overlap the gate electrode 330. In this case, first and second dielectrics (not shown) may extend from both end portions of the gate electrode 330, and the source electrode and the drain electrode may respectively overlap the first and second dielectrics.

The interconnect 345 may be provided in the substrate 310 and electrically connected to the gate electrode 330 to apply an electrical signal to the gate electrode 330. For example, the interconnect 345 may be provided in the substrate 310 such that the interconnect 345 may be in contact with a lower surface of the gate electrode 330. The interconnect 345 may be formed by filling a conductive material in a through-hole formed in the substrate 310. The interconnect 345 may include, for example, a conductive material such as cobalt (Co) or tungsten (W). However, the interconnect 345 is not limited thereto, and examples of the conductive material may include various other materials.

Figure 15:
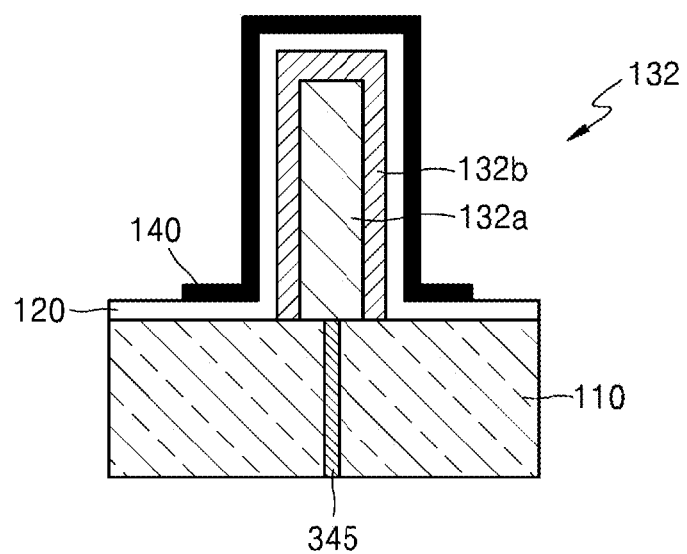
FIG. 15 is a view illustrating a modification of a gate electrode that may be employed in the semiconductor device shown in FIGS. 5 and 7.

In some embodiments, as depicted in FIG. 15, the semiconductor device in FIG. 7 may be further modified to include an interconnect 345 in the substrate 110 and electrically connected to the gate electrode 132 to apply an electrical signal to the gate electrode 132. The interconnect 345 in FIG. 15 may be formed of the same materials as the interconnect 345 in FIG. 7 so a detailed description thereof is omitted.

Figure 8:
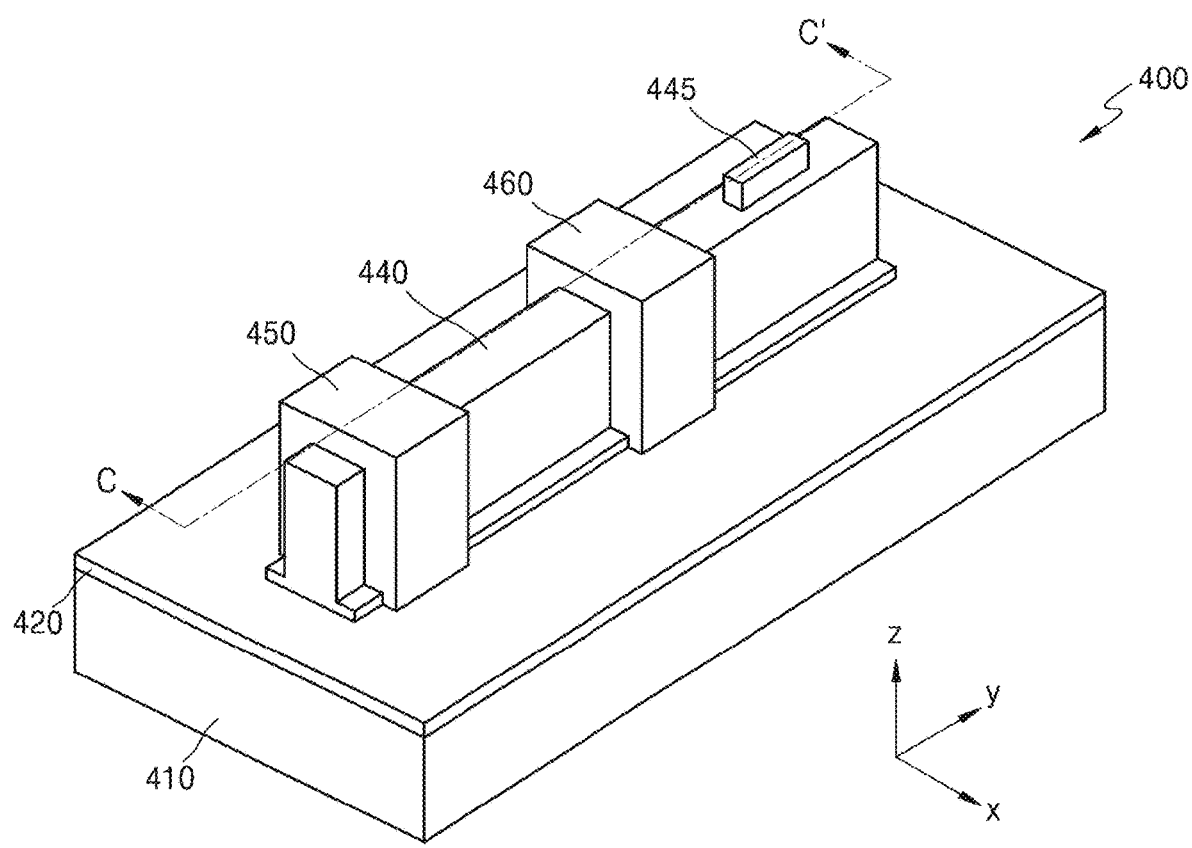
FIG. 8 is a perspective view illustrating a semiconductor device according to another example embodiment.

FIG. 8 is a perspective view illustrating a semiconductor device 400 according to another example embodiment. In addition, FIG. 9 is a cross-sectional view taken along line C-C' of FIG. 8.

Figure 9:
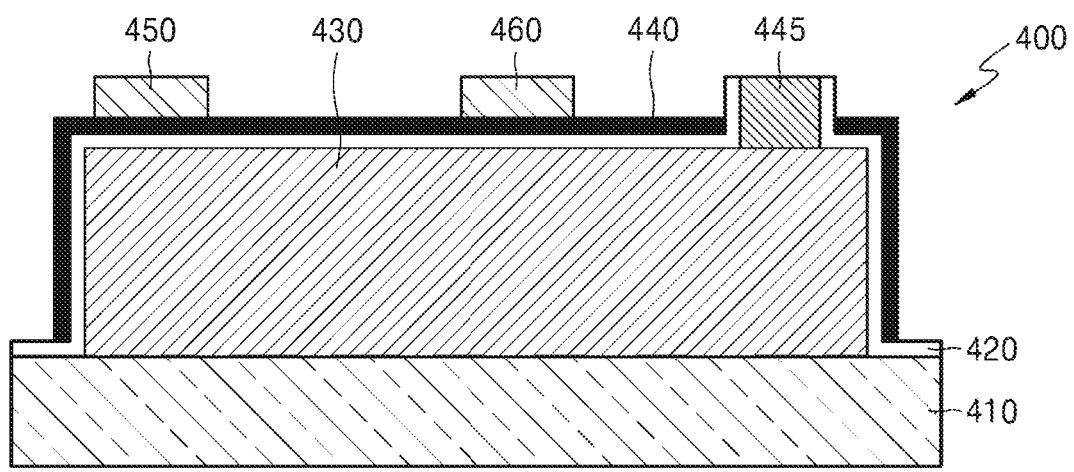
FIG. 9 is a cross-sectional view taken along line C-C' of FIG. 8.

Referring to FIGS. 8 and 9, in the semiconductor device 400, a fin-shaped gate electrode 430 is provided on an upper surface of a substrate 410, and a gate dielectric 420 is provided to cover the gate electrode 430. In addition, a channel layer 440 including a two-dimensional semiconductor material is provided on the gate dielectric 420. Here, the substrate 410, the gate electrode 430, the gate dielectric 420, and the channel layer 440 are the same as those described above, and thus descriptions thereof will not be repeated here.

A source electrode 450 and a drain electrode 460 are provided on the channel layer 440 at a distance from each other. Here, the source electrode 450 and the drain electrode 460 are electrically connected to the channel layer 440. The source electrode 450 and the drain electrode 460 may overlap the gate electrode 430. In addition, an interconnect 445 for applying an electrical signal to the gate electrode 430 is provided on an upper portion of the gate electrode 430.

The interconnect 445 is provided on the upper portion of the gate electrode 430 at a position outside the drain electrode 460. Here, the interconnect 445 may be in contact with an upper surface of the gate electrode 430 through the channel layer 440 and the gate dielectric 420. The gate dielectric 420 may extend between the interconnect 445 and the channel layer 440 for electrical insulation therebetween.

In the above, the case in which the interconnect 445 is provided on an upper portion of the gate electrode 430 at a position outside the drain electrode 460 is described. However, this is a non-limiting example, and in another example, the interconnect 445 may be provided on an upper portion of the gate electrode 430 at a position outside the source electrode 450.

Figure 10:
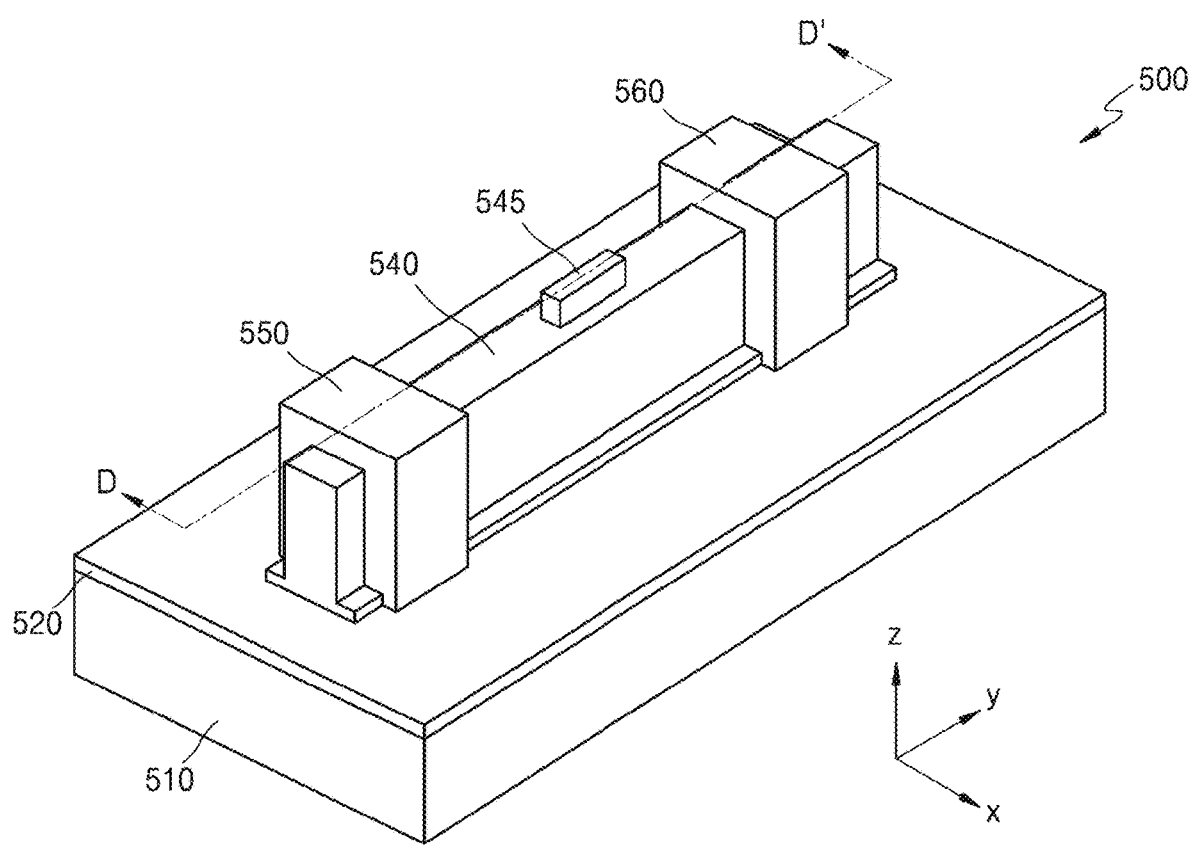
FIG. 10 is a perspective view illustrating a semiconductor device according to another example embodiment.

FIG. 10 is a perspective view illustrating a semiconductor device 500 according to another example embodiment. In addition, FIG. 11 is a cross-sectional view taken along line D-D' of FIG. 10.

Figure 11:
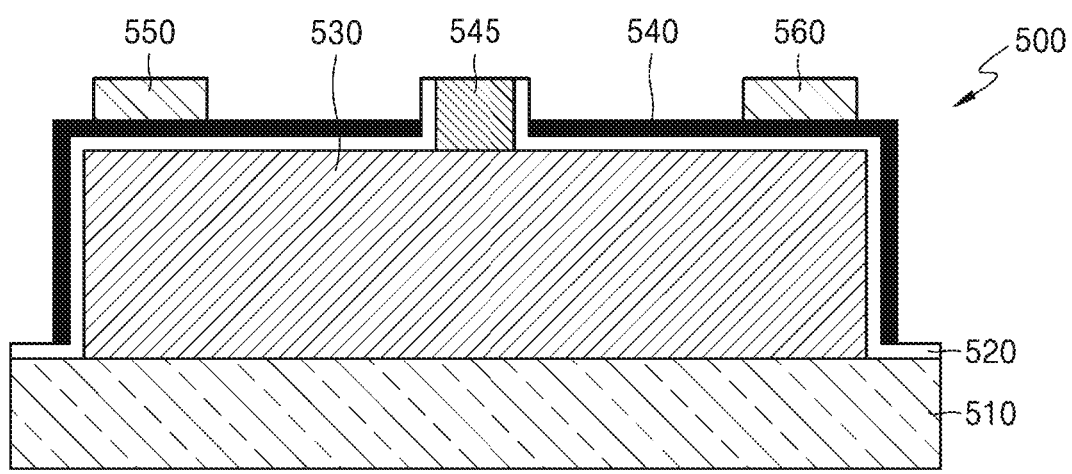
FIG. 11 is a cross-sectional view taken along line D-D' of FIG. 10.

Referring to FIGS. 10 and 11, in the semiconductor device 500, a fin-shaped gate electrode 530 is provided on an upper surface of a substrate 510, and a gate dielectric 520 is provided to cover the gate electrode 530. In addition, a channel layer 540 including a two-dimensional semiconductor material is provided on the gate dielectric 520.

A source electrode 550 and a drain electrode 560 are provided on both sides of the channel layer 560, respectively. The source electrode 550 and the drain electrode 560 are electrically connected to the channel layer 540. The source electrode 550 and the drain electrode 560 may overlap the gate electrode 530.

Alternatively, the source electrode 550 and the drain electrode 560 may not overlap the gate electrode 530. In this case, first and second dielectrics (not shown) may extend from both end portions of the gate electrode 330, and the source electrode 550 and the drain electrode 560 may respectively overlap the first and second dielectrics.

An interconnect 545 for applying an electrical signal to the gate electrode 530 is provided on an upper portion of the gate electrode 530. The interconnect 545 is provided on the upper portion of the gate electrode 430 at a position between the source electrode 550 and the drain electrode 560. Here, the interconnect 545 may be in contact with an upper surface of the gate electrode 530 through the channel layer 540 and the gate dielectric 520.

Figure 12:
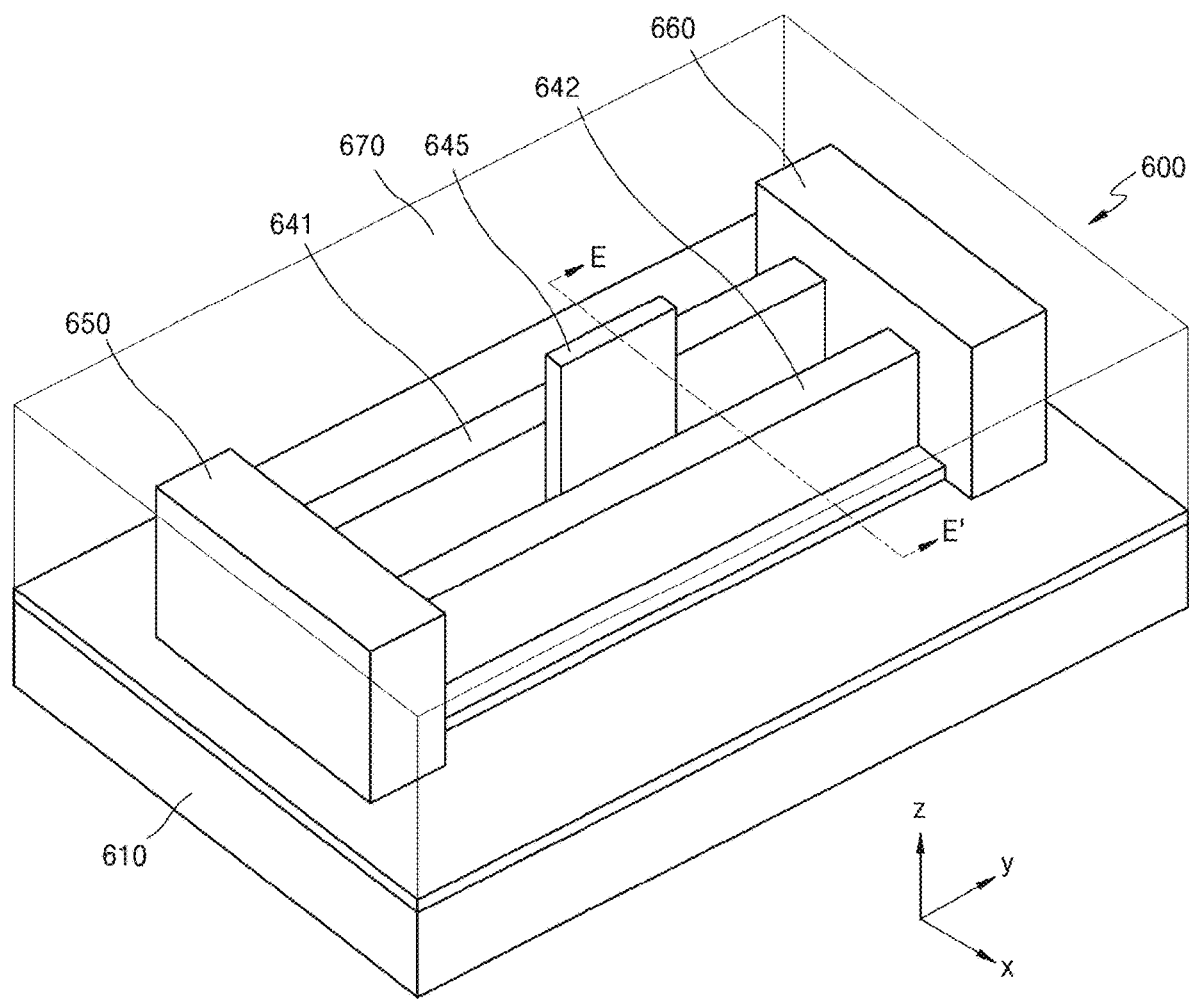
FIG. 12 is a perspective view illustrating a semiconductor device according to another example embodiment.

FIG. 12 is a perspective view illustrating a semiconductor device 600 according to another example embodiment. In addition, FIG. 13 is a cross-sectional view taken along line E-E' of FIG. 12.

Figure 13:
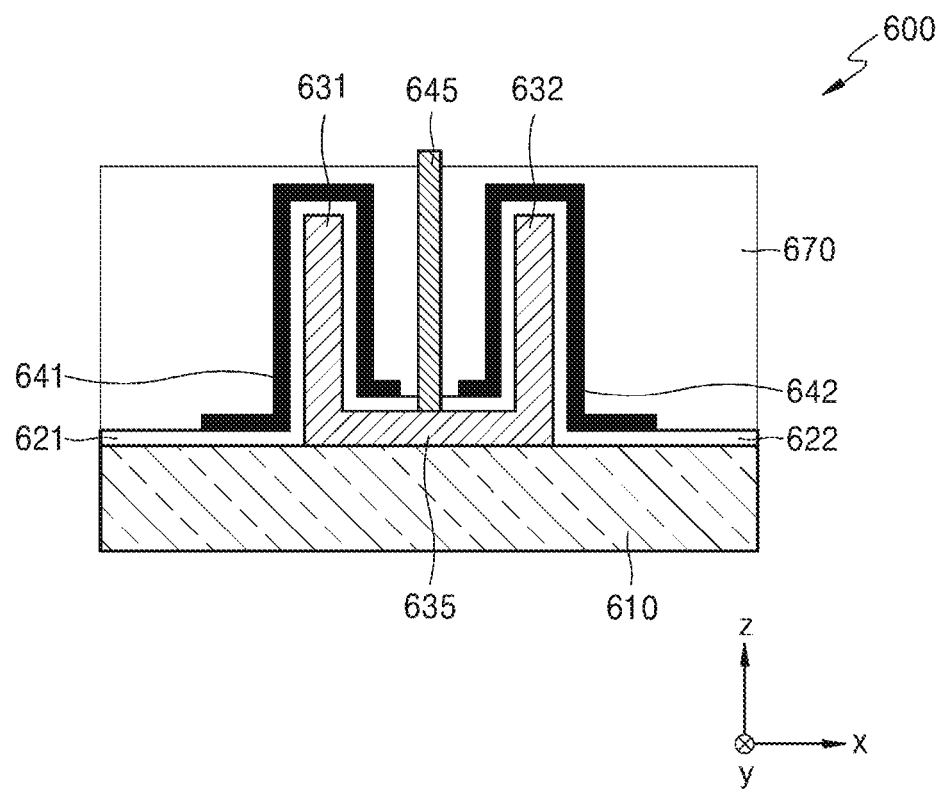
FIG. 13 is a cross-sectional view taken along line E-E' of FIG. 12.

Referring to FIGS. 12 and 13, the semiconductor device 600 includes first and second gate electrodes 631 and 632, a connection electrode 635, first and second gate dielectrics 621 and 622, first and second channel layers 641 and 642, a source electrode 650, and a drain electrode 660.

The first and second gate electrodes 631 and 632 may be provided on a substrate 610 at a distance from each other. Here, the first and second gate electrodes 631 and 632 may be arranged side by side with each other. However, the first and second gate electrodes 631 and 632 are not limited thereto. The substrate 610 may include, for example, an insulating substrate. In addition, the substrate 610 may include a semiconductor substrate (not shown) having an insulating layer formed on a surface thereof.

Each of the first and second gate electrodes 631 and 632 may have a fin shape having a width, a height, and a length. Here, each of the first and second gate electrodes 631 and 632 may have a shape with a height greater than a width. For example, the first and second gate electrodes 631 and 632 may each have a height/width ratio, that is, an aspect ratio, within the range of greater than about 1 but less than or equal to about 20.

Each of the first and second gate electrodes 631 and 632 may have, for example, a rectangular cross-section. In this case, each of the first and second gate electrodes 631 and 632 may be arranged substantially perpendicular to the surface of the substrate 610. Alternatively, the first and second gate electrodes 631 and 632 may have, for example, a trapezoidal cross-section.

The first and second gate electrodes 631 and 632 may include a metallic material or a conductive oxide. Here, the metallic material may include, for example, at least one of (or selected from the group consisting of) gold (Au), titanium (Ti), TiN, TaN, tungsten (W), molybdenum (Mo), WN, platinum (Pt), and nickel (Ni), and the conductive oxide may include, for example, ITO, IZO, or the like. However, these materials are merely examples.

The connection electrode 635 may be provided on the substrate 610 to connect the first and second gate electrodes 631 and 632 to each other. Here, the connection electrode 635 has a function of electrically connecting the first gate electrode 631 and the second gate electrode 632 to each other. The connection electrode 635 may be formed in one piece with the first and second gate electrodes 631 and 632. In this case, the connection electrode 635 may include the same material as the first and second gate electrodes 631 and 632. Alternatively, the connection electrode 635 may not be formed in one piece with the first and second gate electrodes 631 and 632.

The first and second gate dielectrics 621 and 622 are respectively provided on the first and second gate electrodes 631 and 632. The first gate dielectric 621 may cover the first gate electrode 631, and the second gate dielectric 622 may cover the second gate electrode 632. In this case, at least a portion of the connection electrode 635 of the first and second gate electrodes 631 and 632 is opened through the first and second gate dielectrics 621 and 622.

The first and second gate dielectrics 621 and 622 may include, for example, a high-k dielectric material. The first and second gate dielectrics 621 and 622 may include a ferroelectric material, and if necessary, the ferroelectric material may further include a dopant. In addition, the first and second gate dielectrics 621 and 622 may have a multi-layer structure including a high-k material and a ferroelectric material. In addition, the first and second gate dielectrics 621 and 622 may include a charge trapping material, and in this case, the semiconductor device 600 may have memory characteristics.

The first channel layer 641 is provided on the first gate dielectric 621, and the second channel layer 642 is provided on the second gate dielectric 622. The first channel layer 641 is provided on the first gate dielectric 621 covering the first gate electrode 631, and the second channel layer 642 is provided on the second gate dielectric 622 covering the second gate electrode 632.

The first and second channel layers 641 and 642 may include a two-dimensional semiconductor material. Here, the two-dimensional semiconductor material may have a monolayer or multilayer structure. The two-dimensional semiconductor material of the first and second channel layers 641 and 642 may have a thickness of about 10 nm or less, but is not limited thereto.

The two-dimensional semiconductor material may include, for example, at least one of (or selected from the group consisting of) graphene, black phosphorus, and a TMD. Here, the TMD may include: a metal element selected from molybdenum (Mo), tungsten (W), niobium (Nb), vanadium (V), tantalum (Ta), titanium (Ti), zirconium (Zr), hafnium (Hf), technetium (Tc), rhenium (Re), copper (Cu), gallium (Ga), indium (In), tin (Sn), germanium (Ge), or lead (Pb); and a chalcogen selected from sulfur (S), selenium (Se), or tellurium (Te). The two-dimensional semiconductor material may be doped with a p-type dopant or an n-type dopant to control mobility.

The source and drain electrodes 650 and 660 are respectively provided on both sides of the first and second channel layers 641 and 642. Here, the source electrode 650 may be provided on sides of the first and second channel layers 641 and 642, and the drain electrode 660 may be provided on the other sides of the first and second channel layers 641 and 642. The source and drain electrodes 650 and 660 may include a metallic material having high electrical conductivity.

The source and drain electrodes 650 and 660 may overlap the first and second gate electrodes 631 and 632. Alternatively, the source and drain electrodes 650 and 660 may not overlap the first and second gate electrodes 631 and 632. In this case, first and second dielectrics (not shown) may extend from both end portions of each of the first and second gate electrodes 631 and 632, and the source and drain electrodes 650 and 660 may overlap the first and second dielectrics.

An interconnect 645 may be provided on an upper portion of the connection electrode 635 and electrically connected to the connection electrode 635. The interconnect 645 may apply an electrical signal to the first and second gate electrodes 631 and 632 through the connection electrode 635. The interconnect 645 may be in contact with an upper surface of the connection electrode 635 which is opened through the first and second gate dielectrics 621 and 622.

Here, the interconnect 645 may be positioned between the source electrode 650 and the drain electrode 660.

An insulating layer 670 may be further provided on the substrate 610 such that the semiconductor device 600 may be embedded in the insulating layer. Here, the insulating layer 670 may include, for example, a low-k dielectric material, but is not limited thereto. In the above, the case in which the interconnect 645 is positioned between the source electrode 650 and the drain electrode 660 has been described. However, embodiments are not limited thereto, and the interconnect 645 may be provided outside the source electrode 650 or the drain electrode 660.

In the above, the case in which two fin-shaped gate electrodes 631 and 632 are provided on the substrate 610 has been described. However, embodiments are not limited thereto, and three or more gate electrodes may be provided on the substrate 610. In this case, connection electrodes may be provided between the gate electrodes, and interconnects may be electrically connected to the connection electrodes.

Figure 16:
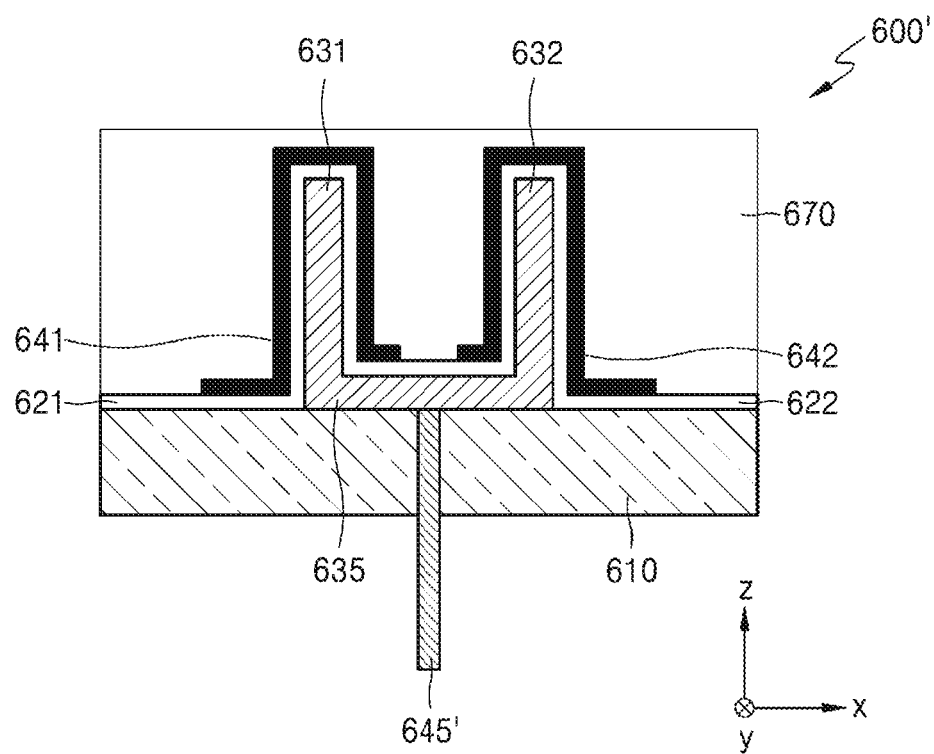
FIG. 16 is a view illustrating a modification of a gate electrode that may be employed in the semiconductor device shown in FIGS. 12-13.

FIG. 16 is a view illustrating a modification of a gate electrode that may be employed in the semiconductor device shown in FIGS. 12-13.

Referring to FIG. 16, a semiconductor device 600' according to example embodiments may be the same as the semiconductor device 600 in FIGS. 12-13, except the interconnect 645' may extend through the substrate 610 and contact a bottom surface of the connection electrode 635. The interconnect 645' may be formed of the same materials described above for the interconnect 645 in FIGS. 12-13 so a detailed description thereof is omitted.

In addition, a plurality of such semiconductor devices as described above may be arranged horizontally or vertically. Although embodiments have been described, the embodiments are for illustrative purposes only, and those skilled in the art may make various modifications therefrom.

As described above, when the thickness of silicon of a Si-based FinFET is several nanometers (nm) or less, the number of carriers in the silicon reduces, and thus electron mobility reduces. In the semiconductor devices of the example embodiments, however, the channel layers include a two-dimensional semiconductor material, and thus even when the channel layers have a thickness of several nanometers (nm) or less, the channel layers may maintain high electron mobility. Therefore, the semiconductor devices may be implemented as high-performance semiconductor devices having a fine size, for example, FinFETs having a fine channel width within the range of greater than 0 nm and about 10 nm or less.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of inventive concepts as defined by the following claims.

What is claimed is:

1. A semiconductor device comprising:
a substrate;
a gate electrode on the substrate, the gate electrode having a shape with a height greater than a width;
a gate dielectric on the gate electrode;
a channel layer on the gate dielectric, the channel layer comprising a two-dimensional semiconductor material; and
a source electrode and a drain electrode electrically connected to the channel layer,
wherein the channel layer has a thickness of greater than 0 nm and about 10 nm or less,
wherein the gate dielectric has a multilayer structure, and includes a ferroelectric material and a charge trapping material,
wherein the height of the gate electrode is defined at a location of the gate electrode not vertically overlapping the source electrode and the drain electrode, and
wherein, at the location of the gate electrode not vertically overlapping the source electrode and the drain electrode, the height of the gate electrode is defined from a lowermost surface of the gate electrode to an uppermost surface of the gate electrode.

2. The semiconductor device of claim 1, wherein the substrate comprises an insulating material.

3. The semiconductor device of claim 2, wherein the substrate further comprises a semiconductor material.

4. The semiconductor device of claim 1, wherein the gate electrode has a height/width ratio that is greater than about 1 but less than about 20.

5. The semiconductor device of claim 1, wherein the gate electrode comprises a metallic material or a conductive oxide.

6. The semiconductor device of claim 1, wherein the gate electrode comprises a conductive layer and a dielectric, and the dielectric is in the conductive layer.

7. The semiconductor device of claim 1, wherein the two-dimensional semiconductor material comprises graphene, black phosphorus, a transition metal dichalcogenide (TMD), or a combination thereof.

8. The semiconductor device of claim 1, wherein the source electrode and the drain electrode overlap the gate electrode.

9. The semiconductor device of claim 1, wherein
the gate dielectric includes a first dielectric and a second dielectric,
the first dielectric extends from a first end portion of the gate electrode,
the second dielectric extends from a second end portion of the gate electrode, and
the source electrode and the drain electrode overlap the first dielectric and the second dielectric, respectively.

10. The semiconductor device of claim 1, further comprising:
an interconnect in the substrate, the interconnect being electrically connected to the gate electrode.

11. The semiconductor device of claim 1, further comprising:
an interconnect on an upper portion of the gate electrode, the interconnect being electrically connected to the gate electrode.

12. A semiconductor device comprising:
a substrate;
a gate electrode on an upper surface of the substrate;
a gate dielectric on the substrate, the gate dielectric including a portion covering the gate electrode and having a shape with a height greater than a width;
a channel layer on the gate electric and the gate electrode, the channel layer comprising a two-dimensional semiconductor material; and
a source electrode and a drain electrode electrically connected to the channel layer, wherein the channel layer has a thickness of greater than 0 nm and about 10 nm or less, wherein the gate dielectric has a multilayer structure, and includes a ferroelectric material and a charge trapping material, wherein the height of the gate electrode is defined at a location of the gate electrode not vertically overlapping the source electrode and the drain electrode, and at the location of the gate electrode not vertically overlapping the source electrode and the drain electrode, the height of the gate electrode is defined from a lowermost surface of the gate electrode to an uppermost surface of the gate electrode.

13. The semiconductor device of claim 12, wherein the substrate comprises an insulating material.

14. The semiconductor device of claim 12, wherein the two-dimensional semiconductor material comprises graphene, black phosphorus, a transition metal dichalcogenide (TMD), or a combination thereof.

15. The semiconductor device of claim 12, wherein a ratio of the height of the gate electrode to a width of the gate electrode is greater than about 1 and less than about 20.

* * * * *